United States Patent
Sasaki et al.

(10) Patent No.: US 9,437,689 B2
(45) Date of Patent: Sep. 6, 2016

(54) GA2O3 SEMICONDUCTOR ELEMENT

(75) Inventors: Kohei Sasaki, Tokyo (JP); Masataka Higashiwaki, Tokyo (JP)

(73) Assignees: TAMURA CORPORATION, Tokyo (JP); NATIONAI INSTITUTE OF INFORMATION AND COMMUNICATIONS TECHNOLOGY, Tokyo (JP)

( * ) Notice: Subject to any disclaimer, the term of this patent is extended or adjusted under 35 U.S.C. 154(b) by 0 days.

(21) Appl. No.: 14/343,367

(22) PCT Filed: Sep. 7, 2012

(86) PCT No.: PCT/JP2012/072897
§ 371 (c)(1),
(2), (4) Date: Mar. 6, 2014

(87) PCT Pub. No.: WO2013/035842
PCT Pub. Date: Mar. 14, 2013

(65) Prior Publication Data
US 2014/0217469 A1    Aug. 7, 2014

(30) Foreign Application Priority Data
Sep. 8, 2011  (JP) ................. 2011-196435

(51) Int. Cl.
*H01L 29/24*     (2006.01)
*H01L 29/78*     (2006.01)
(Continued)

(52) U.S. Cl.
CPC ......... *H01L 29/24* (2013.01); *H01L 21/02414* (2013.01); *H01L 21/02433* (2013.01); *H01L 21/02565* (2013.01); *H01L 21/02576* (2013.01);
(Continued)

(58) Field of Classification Search
CPC ............... H01L 2224/05105; H01L 29/4236; H01L 29/66734; H01L 29/7397; H01L 29/24
See application file for complete search history.

(56) References Cited

U.S. PATENT DOCUMENTS 6,168,996 B1    1/2001   Numazawa et al.
6,686,616 B1 *  2/2004   Allen et al. ................... 257/280
(Continued)

FOREIGN PATENT DOCUMENTS

CN          1754013 A      3/2006
CN        101091258 A     12/2007
(Continued)

OTHER PUBLICATIONS

Suzuki, et al. "Fabrication and Characterization of transparent conductive Sn-doped B-Ga2O3 single crystal", phys. stat. sol. (c) 4, No. 7, pp. 2310-2313, (2007).*
Villora, et al., "Rf-plasma-assisted molecular-beam epitaxy of β-Ga2O3", App. Phys. Lett. 88, 031105, (2006), pp. 1-3.*
Higashiwaki, et al., "Gallium oxide (Ga2O3) metal-semiconductor field-effect transistors on single crystal beta-Ga2O3 (010) substrates", Applied Physics Letters 100, 013504, 2012, pp. 1-4.*
(Continued)

*Primary Examiner* — Matthew Reames
*Assistant Examiner* — Vincent Wall
(74) *Attorney, Agent, or Firm* — McGinn IP Law Group PLLC

(57) ABSTRACT

A $Ga_2O_3$ semiconductor element includes: an n-type $\beta$-$Ga_2O_3$ single crystal film, which is formed on a high-resistance $\beta$-$Ga_2O_3$ substrate directly or with other layer therebetween; a source electrode and a drain electrode, which are formed on the n-type $\beta$-$Ga_2O_3$ single crystal film; and a gate electrode, which is formed on the n-type $\beta$-$Ga_2O_3$ single crystal film between the source electrode and the drain electrode.

17 Claims, 10 Drawing Sheets

(51) Int. Cl.

| | |
|---|---|
| *H01L 29/786* | (2006.01) |
| *H01L 29/812* | (2006.01) |
| *H01L 21/02* | (2006.01) |
| *H01L 29/772* | (2006.01) |
| *H01L 29/66* | (2006.01) |
| *H01L 29/04* | (2006.01) |

(52) U.S. Cl.
CPC ... *H01L 21/02581* (2013.01); *H01L 21/02631* (2013.01); *H01L 29/045* (2013.01); *H01L 29/66969* (2013.01); *H01L 29/772* (2013.01); *H01L 29/78* (2013.01); *H01L 29/7816* (2013.01); *H01L 29/7824* (2013.01); *H01L 29/7869* (2013.01); *H01L 29/78603* (2013.01); *H01L 29/812* (2013.01); *H01L 29/8126* (2013.01)

(56) References Cited

U.S. PATENT DOCUMENTS

| | | | |
|---|---|---|---|
| 7,151,280 | B2 | 12/2006 | Hayashi et al. |
| 2003/0137018 | A1* | 7/2003 | Passlack et al. ............. 257/410 |
| 2004/0104429 | A1* | 6/2004 | Takahashi et al. ........... 257/338 |
| 2004/0132249 | A1* | 7/2004 | Mitsuda et al. ............. 438/260 |
| 2006/0076617 | A1 | 4/2006 | Shenoy et al. |
| 2006/0150891 | A1 | 7/2006 | Ichinose et al. |
| 2007/0108512 | A1 | 5/2007 | Sedlmaier |
| 2007/0264782 | A1 | 11/2007 | Shenoy et al. |
| 2008/0197405 | A1 | 8/2008 | Pfirsch |
| 2008/0265264 | A1 | 10/2008 | Ichinose et al. |
| 2010/0229789 | A1 | 9/2010 | Ichinose et al. |
| 2011/0115017 | A1 | 5/2011 | Alter et al. |
| 2012/0304918 | A1 | 12/2012 | Ichinose et al. |
| 2013/0316508 | A1 | 11/2013 | Alter et al. |

FOREIGN PATENT DOCUMENTS

| | | | | |
|---|---|---|---|---|
| EP | 0653786 | A2 | 5/1995 | |
| EP | 1 598 450 | A2 | 11/2005 | |
| JP | 08-018009 | A | 1/1996 | |
| JP | EP 1598450 | A2 * | 11/2005 | ............. C30B 23/02 |
| JP | 2006-269924 | A | 10/2006 | |
| JP | 2008-118011 | A | 5/2008 | |
| JP | 2008-303119 | A | 12/2008 | |
| JP | 2009-049198 | A | 3/2009 | |
| JP | 2009-064970 | A | 3/2009 | |
| JP | 2009-111004 | A | 5/2009 | |
| JP | 2009-126764 | A | 6/2009 | |
| JP | 2009-130013 | A | 6/2009 | |
| JP | 2010-027962 | A | 2/2010 | |
| JP | 2010-219130 | A | 9/2010 | |
| JP | 2011-109100 | A | 6/2011 | |

OTHER PUBLICATIONS

Geller, S., "Crystal Structure of beta-Ga2O3"), Journal of Chemical Physics, 33, 676, 1960, p. 676-84.*

Matsuzaki, et al., "Growth, structure and carrier transport properties of Ga2O3 epitaxial film examined for transparent field-effect transisor", Thin Solid Fims, 496, 2006, 37-21.*

International Search Report dated Oct. 9, 2012 in PCT/JP2012/072897 (English version).

Kosuke Matsuzaki et al, "Growth, structure and carrier transport properties of $Ga_2O_3$ epitaxial film examined for transparent field-effect transistor", Thin Solid films 496 (2006) 37-41.

Kosuke Matsuzaki et al, "Field-Induced current modulation in eptaxial film of deep-ultraviolet transparent oxide semiconductor $Ga_2O_3$", Appl. Phys. Lett. 88, 092106(2006); doi: 10.1063/1.2179373.

United States Office Action dated Dec. 17, 2014 in U.S. Appl. No. 14/343,686.

Japanese Office Action dated Feb. 24, 2015 with partial English Translation.

MingYing Tsai et al., "β-$Ga_2O_3$ growth by plasma-assisted molecular beam epitaxy" J. Vac. Sci. Technol. A, Mar. 2010, vol. 28, No. 2, p. 354-359.

K. Iwaya et al., "Atomically resolved silicon donor states of β-$Ga_2O_3$" Appl. Phys. Lett., Apr. 4, 2011, vol. 98, No. 14, pp. 142116-142116-3.

Extended European Search Report dated Apr. 10, 2015.

Casady, et al. "Silicon Carbide Power MOSFET Technology", Proceedings of the IEEE 24th Int'l Symposium on Compound Semiconductors, vol. 156, 1997, pp. 359-362.

Otake, et al. "Vertical GaN-Based Trench Gate Metal Oxide Semiconductor Field-Effect Transistors on GaN Bulk Substrates", Applied Physics Express, vol. 1, No. 1, 2008, pp. 011105-1-011105-3.

Extended European Search Report dated Jun. 23, 2015.

Zitouni, M, et al. "A New Lateral DMOSFET Structure with Extremely Reduced On-Resistance and Enhanced Breakdown Voltage". 8th European Conference on Power Electronics and Applications. Laussanne, CH, Sep. 7-9, 1999; [EPE. European Conference on Power Electronics and Applications], EPE Association, Brussels, BE, vol. Conf. 8, Sep. 7, 1999, pp. 1-09, XP000890316.

Japanese Office Action dated Feb. 24, 2015 with a partial English Translation.

United States Office Action dated May 4, 2015 in U.S. Appl. No. 14/343,686.

Machine Translation of JP2008-303119A.

US Office Action dated Jan. 27, 2016 in U.S. Appl. No. 14/343,686.

Chinese Office Action dated Jan. 4, 2016 with English Translation.

U.S. Notice of Allowance dated May 5, 2016 in U.S. Appl. No. 14/343,686.

European Communication pursuant to Article 94(3) EPC.

* cited by examiner

GA2O3 SEMICONDUCTOR ELEMENT

TECHNICAL FIELD

The invention relates to a $Ga_2O_3$-based semiconductor element.

BACKGROUND ART

A $Ga_2O_3$-based semiconductor element using a $Ga_2O_3$ crystal film formed on a sapphire substrate is known (see, e.g., NPLs 1 and 2).

CITATION LIST

Non Patent Literature

[NPL 1]
K. Matsuzaki et al. Thin Solid Films 496, 2006, pp. 37-41.
[NPL 2]
K. Matsuzaki et al. Appl. Phys. Lett. 88, 092106, 2006.

SUMMARY OF INVENTION

Technical Problem

However, since the crystal structure of $Ga_2O_3$ crystal is completely different from that of sapphire crystal, it is very difficult to heteroepitaxially grow a $Ga_2O_3$ crystal on a sapphire substrate. Thus, it is difficult to form a high-quality $Ga_2O_3$-based semiconductor element by using a $Ga_2O_3$ crystal film grown on a sapphire substrate.

It is an object of the invention to provide a high-quality $Ga_2O_3$-based semiconductor element.

Solution to Problem

According to one embodiment of the invention, a $Ga_2O_3$-based semiconductor element as defined in [1] to [6] below is provided so as to achieve the above object.

[1] A $Ga_2O_3$-based semiconductor element comprising: includes a $\beta$-$Ga_2O_3$ single crystal film that is formed on a $\beta$-$Ga_2O_3$ substrate directly or via an other layer, a source electrode and a drain electrode that are formed on the $\beta$-$Ga_2O_3$ single crystal film, and a gate electrode that is formed on the $\beta$-$Ga_2O_3$ single crystal film between the source electrode and the drain electrode.

[2] The $Ga_2O_3$-based semiconductor element according to [1], wherein the semiconductor element further includes a $Ga_2O_3$ based MISFET, and the gate electrode is formed on the $\beta$-$Ga_2O_3$ single crystal film via a gate insulating film.

[3] The $Ga_2O_3$-based semiconductor element according to [1] or [2], wherein the semiconductor element further comprises includes a source region and a drain region formed in the $\beta$-$Ga_2O_3$ single crystal film under the source electrode and the drain electrode, respectively.

[4] The $Ga_2O_3$-based semiconductor element according to [3], wherein the $\beta$-$Ga_2O_3$ single crystal film, the source region and the drain region are of an n-type, and the semiconductor element further includes a p-type or high-resistance body region formed in the $\beta$-$Ga_2O_3$ single crystal film so as to surround the source region.

[5] The $Ga_2O_3$-based semiconductor element according to [1], wherein the semiconductor element further comprises includes a $Ga_2O_3$-based MESFET, and wherein the gate electrode is formed directly on the $\beta$-$Ga_2O_3$ single crystal film.

[6] The $Ga_2O_3$-based semiconductor element according to [5], wherein the $\beta$-$Ga_2O_3$ single crystal film is of an n-type, and wherein the semiconductor element further comprises includes an n-type source region and an n-type drain region formed in the $\beta$-$Ga_2O_3$ single crystal film under the source electrode and the drain electrode, respectively. When the main surface of the high-resistance $\beta$-$Ga_2O_3$ substrate is a plane rotated by not less than 50° and not more than 90° with respect the (100) plane, it is possible to effectively suppress re-evaporation of raw materials of the $\beta$-$Ga_2O_3$-based crystal from the high-resistance $\beta$-$Ga_2O_3$ substrate at the time of epitaxially growing the $\beta$-$Ga_2O_3$-based crystal on the high-resistance $\beta$-$Ga_2O_3$ substrate. In detail, where a percentage of the re-evaporated raw material during growth of the $\beta$-$Ga_2O_3$-based crystal at a growth temperature of 500° C. is defined as 0%, the percentage of the re-evaporated raw material can be suppressed to not more than 40% when the main surface of the high-resistance $\beta$-$Ga_2O_3$ substrate is a plane rotated by not less than 50° and not more than 90° with respect the (100) plane. It is thus possible to use not less than 60% of the supplied raw material to form the $\beta$-$Ga_2O_3$-based crystal, which is preferable from the viewpoint of growth rate and manufacturing cost of the $\beta$-$Ga_2O_3$-based crystal.

Advantageous Effects of Invention

According to an embodiment of the invention, a high-quality $Ga_2O_3$-based semiconductor element can be provided.

DESCRIPTION OF EMBODIMENTS

According to the present embodiment, it is possible to form a high-quality $\beta$-$Ga_2O_3$-based single crystal film by homoepitaxial growth and use of such a high-quality $\beta$-$Ga_2O_3$-based single crystal film allows a high-quality $Ga_2O_3$-based semiconductor element to be formed. Examples of embodiments thereof will be described in detail below.

First Embodiment

A $Ga_2O_3$-based MISFET (Metal Insulator Semiconductor Field Effect Transistor) as the high-quality $Ga_2O_3$-based semiconductor element will be described in the first embodiment.

(Structure of $Ga_2O_3$-based MISFET)

Figure 1:
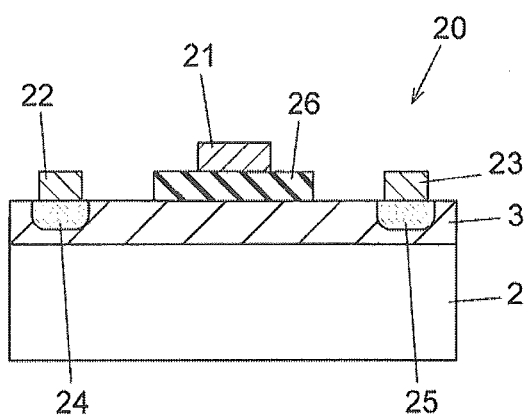
FIG. 1 is a cross sectional view showing a $Ga_2O_3$-based MISFET in a first embodiment.

FIG. 1 is a cross sectional view showing a $Ga_2O_3$-based MISFET 20 in the first embodiment. The $Ga_2O_3$-based MISFET 20 includes an n-type β-$Ga_2O_3$ single crystal film 3 formed on a high-resistance β-$Ga_2O_3$ substrate 2, a source electrode 22 and a drain electrode 23 which are formed on the n-type β-$Ga_2O_3$ single crystal film 3, a gate electrode 21 formed on the n-type β-$Ga_2O_3$ single crystal film 3 between the source electrode 22 and the drain electrode 23 via a gate insulating film 26, and a source region 24 and a drain region 25 which are formed in the n-type β-$Ga_2O_3$ single crystal film 3 respectively under the source electrode 22 and the drain electrode 23.

The high-resistance β-$Ga_2O_3$ substrate 2 is a β-$Ga_2O_3$ substrate of which resistance is increased by adding a p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N or P.

Plane orientation of the main surface of the high-resistance β-$Ga_2O_3$ substrate 2 is not specifically limited but a plane rotated by not less than 50° and not more than 90° with respect a (100) plane is preferable. In other words, in the high-resistance β-$Ga_2O_3$ substrate 2, an angle θ (0<θ≤90°) formed between the main surface and the (100) plane is preferably not less than 50°. Examples of the plane rotated by not less than 50° and not more than 90° with respect the (100) plane include a (010) plane, a (001) plane, a (−201) plane, a (101) plane and a (310) plane.

When the main surface of the high-resistance β-$Ga_2O_3$ substrate 2 is a plane rotated by not less than 50° and not more than 90° with respect the (100) plane, it is possible to effectively suppress re-evaporation of raw materials of the β-$Ga_2O_3$-based crystal from the high-resistance β-$Ga_2O_3$ substrate 2 at the time of epitaxially growing the β-$Ga_2O_3$-based crystal on the high-resistance β-$Ga_2O_3$ substrate 2. In detail, where a percentage of the re-evaporated raw material during growth of the β-$Ga_2O_3$-based crystal at a growth temperature of 500° C. is defined as 0%, the percentage of the re-evaporated raw material can be suppressed to not more than 40% when the main surface of the high-resistance β-$Ga_2O_3$ substrate 2 is a plane rotated by not less than 50° and not more than 90° with respect the (100) plane. It is thus possible to use not less than 60% of the supplied raw material to form the β-$Ga_2O_3$-based crystal, which is preferable from the viewpoint of growth rate and manufacturing cost of the β-$Ga_2O_3$-based crystal.

The β-$Ga_2O_3$ crystal has a monoclinic crystal structure and typically has lattice constants of a=12.23 Å, b=3.04 Å, c=5.80 Å, α=γ=90° and β=103.7°. In the β-$Ga_2O_3$ crystal, the (100) plane comes to coincide with the (310) plane when rotated by 52.5° around the c-axis and comes to coincide with the (010) plane when rotated by 90°. Meanwhile, the (100) plane comes to coincide with the (101) plane when rotated by 53.8° around the b-axis, comes to coincide with the (001) plane when rotated by 76.3° and comes to coincide with the (−201) plane when rotated by 53.8°.

Alternatively, the main surface of the high-resistance β-$Ga_2O_3$ substrate 2 may be a plane rotated at an angle of not more than 37.5° with respect to the (010) plane. In this case, it is possible to provide a steep interface between the high-resistance β-$Ga_2O_3$ substrate 2 and the n-type β-$Ga_2O_3$ single crystal film 3 and it is also possible to highly accurately control the thickness of the i-type β-$Ga_2O_3$ single crystal film 3.

The n-type β-$Ga_2O_3$ single crystal film 3 is an electrically conductive single crystal film formed on the high-resistance β-$Ga_2O_3$ substrate 2 by the below-described method. The n-type β-$Ga_2O_3$ single crystal film 3 includes an n-type dopant such as Sn, Ti, Zr, Hf, V, Nb, Ta, Mo, W, Ru, Rh, Ir, C, Si, Ge, Pb, Mn, As, Sb, Bi, F, Cl, Br and I. In addition, the thickness of the n-type β-$Ga_2O_3$ single crystal film 3 is, e.g., about 10 to 1000 nm.

Here, another film such as a non-doped β-$Ga_2O_3$ single crystal film may be formed between the high-resistance β-$Ga_2O_3$ substrate 2 and the n-type β-$Ga_2O_3$ single crystal film 3. In this case, the non-doped β-$Ga_2O_3$ single crystal film is formed on the high-resistance β-$Ga_2O_3$ substrate 2 by homoepitaxial growth and the n-type β-$Ga_2O_3$ single crystal film 3 is formed on the non-doped β-$Ga_2O_3$ single crystal film by homoepitaxial growth.

The gate electrode 21, the source electrode 22 and the drain electrode 23 are formed of, e.g., a metal such as Au, Al, Ti, Sn, Ge, In, Ni, Co, Pt, W, Mo, Cr, Cu and Pb, an alloy containing two or more of such metals, or a conductive compound such as ITO. In addition, the structure thereof may be a two-layer structure composed of two different metals, e.g., Al/Ti, Au/Ni or Au/Co.

The gate insulating film 26 is formed of an insulating material such as $SiO_2$, AlN, SiN, $Al_2O_3$ or β-$(Al_xGa_{1-x})_2O_3$ (0≤x≤1). Of those, β-$(Al_xGa_{1-x})_2O_3$ can be grown as a single crystal film on a β-$Ga_2O_3$ crystal and thus allows a good semiconductor/insulating film interface with less interface states to be formed, resulting in better gate characteristics than when using other insulating films.

The source region 24 and the drain region 25 are regions having a high n-type dopant concentration formed in the n-type β-$Ga_2O_3$ single crystal film 3 and are respectively connected to the source electrode 22 and the drain electrode 23. It should be noted that the source region 24 and the drain region 25 do not need to be provided in the $Ga_2O_3$-based MISFET 20.

The $Ga_2O_3$-based MISFET 20 is a normally-on transistor. The source electrode 22 is electrically connected to the drain electrode 23 via the n-type β-$Ga_2O_3$ single crystal film 3. Therefore, if a voltage is applied between the source electrode 22 and the drain electrode 23 without applying a voltage to the gate electrode 21, a current flows from the source electrode 22 to the drain electrode 23. On the other hand, when voltage is applied to the gate electrode 21, an inversion layer is formed in the n-type β-$Ga_2O_3$ single crystal film 3 in a region under the gate electrode 21 and a current does not flow from the source electrode 22 to the drain electrode 23 even when voltage is applied between the source electrode 22 and the drain electrode 23.

(Method of Manufacturing $Ga_2O_3$-Based MISFET)

The method of manufacturing the β-$Ga_2O_3$-based single crystal film is PLD (Pulsed Laser Deposition), CVD (Chemical Vapor Deposition), sputtering and MBE (Molecular Beam Epitaxy) etc. In the present embodiment, a thin film growth method using the MBE is employed. The MBE is a crystal growth method in which a single or compound solid is heated in an evaporation source called cell and vapor generated by heat is supplied as a molecular beam onto the surface of the substrate.

Figure 2:
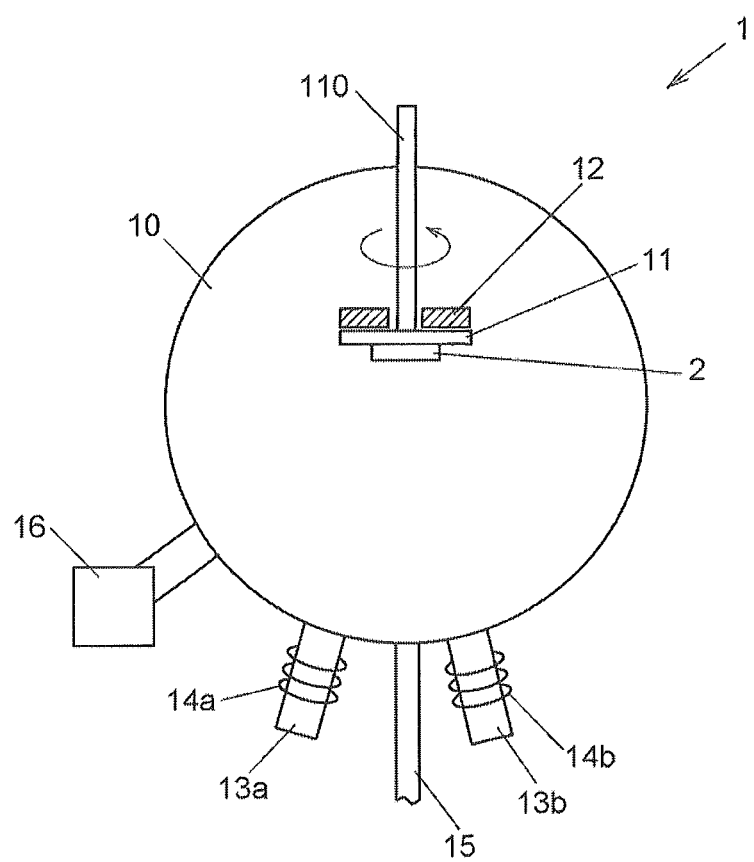
FIG. 2 is a schematic structural diagram illustrating a structure of an MBE system in the first embodiment.

FIG. 2 is a structural diagram illustrating an example MBE system used for forming the β-$Ga_2O_3$-based single crystal film. The MBE system 1 is provided with a vacuum chamber 10, a substrate holder 11 supported in the vacuum chamber 10 to hold the high-resistance β-Ga$_2$O$_3$ substrate 2, heating devices 12 held on the substrate holder 11 to heat the high-resistance β-Ga$_2$O$_3$ substrate 2, plural cells 13 (13a, 13b) each provided for each atom or molecule constituting a thin film, heaters 14 (14a, 14b) for hearing the plural cells 13, a gas supply pipe 15 for supplying oxygen-based gas into the vacuum chamber 10, and a vacuum pump 16 for exhausting the air in the vacuum chamber 10. It is configured that the substrate holder 11 can be rotated by a non-illustrated motor via a shaft 110.

A Ga raw material of the β-Ga$_2$O$_3$-based single crystal film, such as Ga powder, is loaded in the first cell 13a. The Ga powder desirably has a purity of not less than 6N. Powder of an n-type dopant raw material to be doped as a donor is loaded in the second cell 13b. A shutter is provided at an opening of each of the first cell 13a and the second cell 13b.

The preliminarily-formed high-resistance β-Ga$_2$O$_3$ substrate 2 is attached to the substrate holder 11 and a β-Ga$_2$O$_3$ crystal is then homoepitaxially grown on the high-resistance β-Ga$_2$O$_3$ substrate 2 while adding an n-type dopant, thereby forming the n-type β-Ga$_2$O$_3$ single crystal film 3.

The high-resistance β-Ga$_2$O$_3$ substrate 2 is made by, e.g., the following procedure. Firstly, a semi-insulating β-Ga$_2$O$_3$ single crystal ingot doped with Mg is made by the EFG (edge-defined film-fed growth) method. It should be noted that an element to be doped is not limited to Mg. When substituting, e.g., Ga site, it is possible to use H, Li, Na, K, Rb, Cs, Fr, Be, Ca, Sr, Ba, Ra, Mn, Fe, Co, Ni, Pd, Cu, Ag, Au, Zn, Cd, Hg, Ti or Pb. Meanwhile, it is possible to use N or P when substituting oxygen site. For doping Mg, MgO powder is mixed to raw material powder. Not less than 0.05 mol % of MgO is added to impart good insulation properties to the high-resistance β-Ga$_2$O$_3$ substrate 2. Alternatively, the semi-insulating β-Ga$_2$O$_3$ single crystal ingot may be made by the FZ (floating zone) method. The obtained ingot is sliced to a thickness of, e.g., about 1 mm so that the main surface has a desired plane orientation, thereby forming a substrate. Then, a grinding and polishing process is performed to a thickness of about 300 to 600 μm.

Next, the high-resistance β-Ga$_2$O$_3$ substrate 2 made by the above procedure is attached to the substrate holder 11 of the MBE system 1. Next, the vacuum pump 16 is activated to reduce atmospheric pressure in the vacuum chamber 10 to about $10^{-10}$ Torr. Then, the high-resistance β-Ga$_2$O$_3$ substrate 2 is heated by the heating devices 12. Here, radiation heat of heat source such as graphite heater of the heating device 12 is thermally transferred to the high-resistance β-Ga$_2$O$_3$ substrate 2 via the substrate holder 11 and the high-resistance β-Ga$_2$O$_3$ substrate 2 is thereby heated.

After the high-resistance β-Ga$_2$O$_3$ substrate 2 is heated to a predetermined temperature, oxygen-based gas is supplied into the vacuum chamber 10 through the gas supply pipe 15.

After a period of time required for stabilization of gas pressure in the vacuum chamber 10 (e.g., after 5 minutes) since the oxygen-based gas was supplied into the vacuum chamber 10, the first cell 13a and the second cell 13b are respectively heated by the first heater 14a and the second heater 14b while rotating the substrate holder 11 so that Ga and n-type dopant are evaporated and are radiated as molecular beam onto the surface of the high-resistance β-Ga$_2$O$_3$ substrate 2.

For example, the first cell 13a is heated to 900° C. and beam-equivalent pressure (BEP) of Ga vapor is $1 \times 10^{-4}$ Pa.

As such, the β-Ga$_2$O$_3$ crystal is homoepitaxially grown on the main surface of the high-resistance β-Ga$_2$O$_3$ substrate 2 while being doped with the n-type dopant such as Sn and the n-type β-Ga$_2$O$_3$ single crystal film 3 is thereby formed. Growth temperature of the β-Ga$_2$O$_3$ crystal is e.g., 700° C. It should be noted that as the n-type dopant other than Sn, it is possible to use Ti, Zr, Hf, V, Nb, Ta, Mo, W, Ru, Rh, Ir, C, Si, Ge, Pb, Mn, As, Sb and Bi, etc., for substituting Ga site and it is possible to use F, Cl, Br and I, etc., for substituting oxygen site.

Alternatively, the n-type β-Ga$_2$O$_3$ single crystal film 3 may be formed by the PLD (Pulsed Laser Deposition) or the CVD (Chemical Vapor Deposition) etc.

Figure 3A:
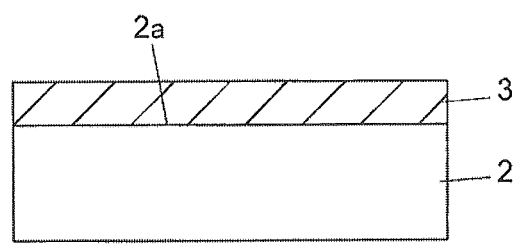
FIG. 3A is a cross sectional view showing a high-resistance $\beta$-$Ga_2O_3$ substrate and an n-type $\beta$-$Ga_2O_3$ single crystal film in the first embodiment.
Figure 3B:
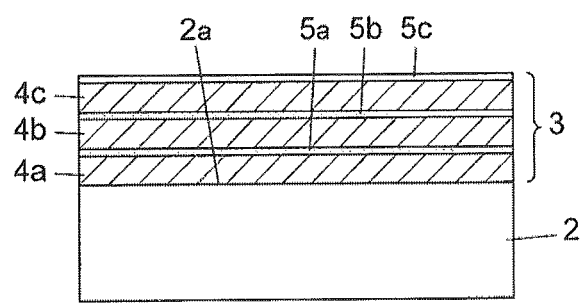
FIG. 3B is a cross sectional view showing a high-resistance $\beta$-$Ga_2O_3$ substrate and a n-type $\beta$-$Ga_2O_3$ single crystal film in the first embodiment.

FIGS. 3A and 3B are cross sectional views showing the n-type β-Ga$_2$O$_3$ single crystal film 3 in the present embodiment. The n-type β-Ga$_2$O$_3$ single crystal film 3 is formed on a main surface 2a of the high-resistance β-Ga$_2$O$_3$ substrate 2 by the MBE mentioned above.

FIG. 3A shows the n-type β-Ga$_2$O$_3$ single crystal film 3 which is formed by continuously adding the n-type dopant during homoepitaxial growth of the β-Ga$_2$O$_3$ crystal.

The donor concentration in the n-type β-Ga$_2$O$_3$ single crystal film 3 is, e.g., $1 \times 10^{15}$ to $1 \times 10^{19}$/cm$^3$ and is especially preferably $1 \times 10^{17}$ to $1 \times 10^{18}$/cm$^3$. This donor concentration can be controlled by temperature of the second cell 13b during film formation.

FIG. 3B shows the n-type β-Ga$_2$O$_3$ single crystal film 3 which is formed by intermittently adding the n-type dopant at certain intervals during homoepitaxial growth of the β-Ga$_2$O$_3$ crystal. In this case, Sn is used as the n-type dopant.

In detail, Sn vapor is intermittently generated from the second cell 13b by operating the shutter of the second cell 13b, thereby intermittently adding Sn to the β-Ga$_2$O$_3$ single. It is preferable that Sn be intermittently added twice or more. In this case, electrical conductivity according to the added amount of Sn can be imparted to the n-type β-Ga$_2$O$_3$ single crystal film 3 without performing annealing treatment.

Due to intermittent Sn addition during the film formation, the n-type β-Ga$_2$O$_3$ single crystal film 3 in FIG. 3B has first layers 4 (4a, 4b, 4c) grown during the period with no Sn addition and second layers 5 (5a, 5b, 5c) grown during the period with Sn addition.

The Sn concentration in the second layer 5 can be controlled by temperature of the second cell 13b during the film formation. The first layer 4, which ideally does not contain Sn, only contains a trace amount of Sn diffused from the second layer 5. Therefore, the Sn concentration in the first layer 4 is lower than that in the second layer 5. An average Sn concentration in the n-type β-Ga$_2$O$_3$ single crystal film 3 is, e.g., $1 \times 10^{14}$ to $3 \times 10^{18}$/cm$^3$ and is especially preferably $1 \times 10^{17}$ to $1 \times 10^{18}$/cm$^3$.

For example, the first layers 4a, 4b and 4c are 3 to 20 nm in thickness and the second layers 5a, 5b and 5c are 0.2 to 1 nm in thickness. If the thickness of the first layers 4a, 4b and 4c is greater than 20 nm, the effect of providing the n-type may be reduced since intervals of the second layers 5a, 5b and 5c are too large. On the other hand, if the thickness of the second layers 5a, 5b and 5c is greater than 1 nm, the effect of intermittently providing the n-type may be reduced since the amount of Sn diffused from the second layers 5a, 5b and 5c into the first layers 4a, 4b and 4c is too large.

It should be noted that the lowermost layer of the n-type β-Ga$_2$O$_3$ single crystal film 3 (the layer in contact with the main surface 2a of the high-resistance β-Ga$_2$O$_3$ substrate 2) may be either the first layer 4 or the second layer 5. In addition, the number of the first layers 4 and that of the second layers 5 are not limited.

After forming the n-type β-Ga$_2$O$_3$ single crystal film 3, the source region 24 and the drain region 25 are formed by ion-implanting the n-type dopant such as Sn into the n-type β-Ga$_2$O$_3$ single crystal film 3. It should be noted that the ion to be implanted is not limited to Sn and, when substituting, e.g., Ga site, it is possible to use Ti, Zr, Hf, V, Nb, Ta, Mo, W, Ru, Rh, Ir, C, Si, Ge, Pb, Mn, As, Sb or Bi. In addition, it is possible to use F, Cl, Br or I when substituting oxygen site. The implantation concentration is, e.g., not less than 1×10$^{18}$/cm$^3$ and not more than 5×10$^{19}$ cm$^3$. The implantation depth is not less than 30 nm. After implantation, the surface of the implanted region is etched about 10 nm by hydrofluoric acid. Sulfuric acid, nitric acid or hydrochloric acid may be used instead. After that, implantation damage is repaired by performing annealing treatment in a nitrogen atmosphere at not less than 800° C. for not less than 30 minutes. In case of performing the annealing treatment in an oxygen atmosphere, treatment temperature is not less than 800° C. and not more than 950° C. and treatment time is not less than 30 minutes.

It should be noted that the method of forming the source region 24 and the drain region 25 is not limited to ion implantation and thermal diffusion process may be used. In this case, after metal such as Sn is brought into contact with the n-type β-Ga$_2$O$_3$ single crystal film 3 in a region for the source region 24 and the drain region 25 to be formed, heat treatment is performed to diffuse a dopant such as Sn into the n-type β-Ga$_2$O$_3$ single crystal film 3. It should be noted that the source region 24 and the drain region 25 do not need to be formed.

After that, the gate insulating film 26, the source electrode 22, the drain electrode 23 and the gate electrode 21 are formed.

Second Embodiment

A Ga$_2$O$_3$-based MESFET (Metal Semiconductor Field Effect Transistor) as the Ga$_2$O$_3$-based semiconductor element will be described in the second embodiment.
(Structure of Ga$_2$O$_3$-Based MESFET)

Figure 4:
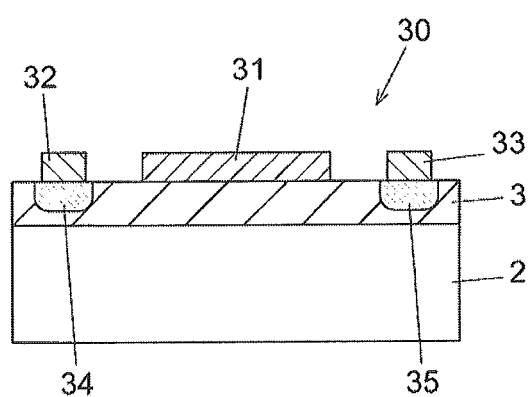
FIG. 4 is a cross sectional view showing a $Ga_2O_3$-based MESFET in a second embodiment.

FIG. 4 is a cross sectional view showing a Ga$_2$O$_3$-based MESFET 30 in the second embodiment. The Ga$_2$O$_3$-based MESFET 30 includes the n-type β-Ga$_2$O$_3$ single crystal film 3 formed on the high-resistance β-Ga$_2$O$_3$ substrate 2, a source electrode 32 and a drain electrode 33 which are formed on the n-type β-Ga$_2$O$_3$ single crystal film 3, a gate electrode 31 formed on the n-type β-Ga$_2$O$_3$ single crystal film 3 between the source electrode 32 and the drain electrode 33, and a source region 34 and a drain region 35 which are foimed in the n-type β-Ga$_2$O$_3$ single crystal film 3 respectively under the source electrode 32 and the drain electrode 33.

The structure and the manufacturing method of the high-resistance β-Ga$_2$O$_3$ substrate 2 and those of the n-type β-Ga$_2$O$_3$ single crystal film 3 are the same as the first embodiment.

The gate electrode 31, the source electrode 32, the drain electrode 33, the source region 34 and the drain region 35 are formed in the same manner as the gate electrode 21, the source electrode 22, the drain electrode 23, the source region 24 and the drain region 25 in the first embodiment. It should be noted that the source region 34 and the drain region 35 do not need to be provided in the Ga$_2$O$_3$-based MESFET 30.

The source electrode 32 is electrically connected to the drain electrode 33 via the n-type β-Ga$_2$O$_3$ single crystal film 3. Meanwhile, a Schottky junction is formed at an interface between the gate electrode 31 and the n-type β-Ga$_2$O$_3$ single crystal film 3 and a depletion layer is thus formed in the n-type β-Ga$_2$O$_3$ single crystal film 3 under the gate electrode 31. The Ga$_2$O$_3$-based MESFET 30 functions as either a normally-off transistor or a normally-on transistor depending on the thickness of the depletion region.

Third Embodiment

Figure 5:
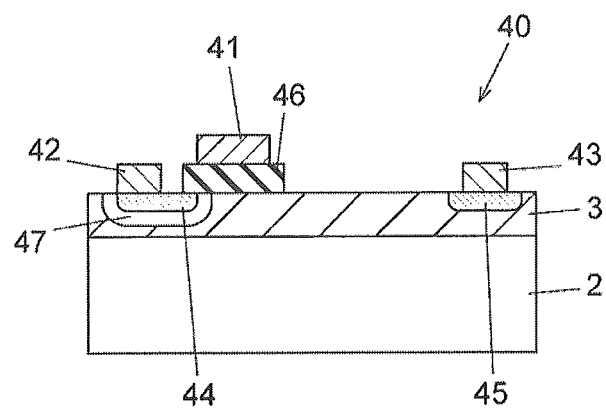
FIG. 5 is a cross sectional view showing a $Ga_2O_3$-based MISFET in a third embodiment.

FIG. 5 is a cross sectional view showing a Ga$_2$O$_3$-based MISFET 40 in the third embodiment. The Ga$_2$O$_3$-based MISFET 40 includes the n-type β-Ga$_2$O$_3$ single crystal film 3 formed on the high-resistance β-Ga$_2$O$_3$ substrate 2, a source electrode 42 and a drain electrode 43 which are formed on the n-type β-Ga$_2$O$_3$ single crystal film 3, a gate electrode 41 formed on the n-type β-Ga$_2$O$_3$ single crystal film 3 between the source electrode 42 and the drain electrode 43 via a gate insulating film 46, a source region 44 and a drain region 45 which are formed in the n-type β-Ga$_2$O$_3$ single crystal film 3 respectively under the source electrode 42 and the drain electrode 43, and a body region 47 surrounding the source region 44.

The structure and the manufacturing method of the high-resistance β-Ga$_2$O$_3$ substrate 2 and those of the n-type β-Ga$_2$O$_3$ single crystal film 3 are the same as the first embodiment.

The gate electrode 41, the source electrode 42, the drain electrode 43, the source region 44, the drain region 45 and the gate insulating film 46 are formed in the same manner as the gate electrode 21, the source electrode 22, the drain electrode 23, the source region 24, the drain region 25 and the gate insulating film 26 in the first embodiment. It should be noted that the source region 44 and the drain region 45 do not need to be provided in the Ga$_2$O$_3$-based MISFET 40.

The body region 47 includes a p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N or P. The body region 47 is a p-type region or a high resistance region which behaves like i-type due to charge compensation.

The body region 47 is formed by ion-implanting a p-type dopant such as Mg into the n-type β-Ga$_2$O$_3$ single crystal film 3. It should be noted that the ion to be implanted is not limited to Mg and, when substituting, e.g., Ga site, it is possible to use H, Li, Na, K, Rb, Cs, Fr, Be, Ca, Sr, Ba, Ra, Mn, Fe, Co, Ni, Pd, Cu, Ag, Au, Zn, Cd, Hg, Tl or Pb. In addition, it is possible to use N or P when substituting oxygen site. After implanting the p-type dopant, damage caused by implantation is repaired by performing annealing treatment.

It should be noted that the method of forming the body region 47 is not limited to ion implantation and thermal diffusion process may be used. In this case, after a metal film such as Mg film is brought into contact with the n-type β-Ga$_2$O$_3$ single crystal film 3 in a region for the body region 47 to be formed, heat treatment is performed to diffuse a dopant such as Mg into the n-type β-Ga$_2$O$_3$ single crystal film 3.

The Ga$_2$O$_3$-based MISFET 40 functions as a normally-off transistor. In a state that voltage is not applied to the gate electrode 41, a current does not flow from the source electrode 42 to the drain electrode 43 due to the presence of the body region 47. When voltage of more than the threshold is applied to the gate electrode 41, a channel is formed in a region of the body region 47 under the gate electrode 41 and a current thus flows from the source electrode 42 to the drain electrode 43.

Fourth Embodiment

Figure 6:
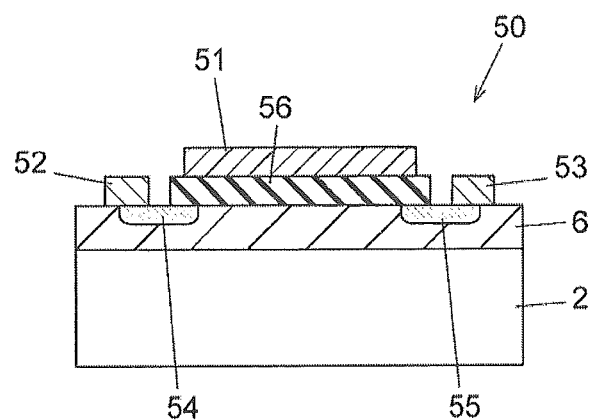
FIG. 6 is a cross sectional view showing a $Ga_2O_3$-based MISFET in a fourth embodiment.

FIG. 6 is a cross sectional view showing a Ga$_2$O$_3$-based MISFET 50 in the fourth embodiment. The Ga$_2$O$_3$-based MISFET 50 includes an undoped β-Ga$_2$O$_3$ single crystal film 6 formed on the high-resistance β-Ga$_2$O$_3$ substrate 2, a source electrode 52 and a drain electrode 53 which are formed on the undoped β-Ga$_2$O$_3$ single crystal film 6, a gate electrode 51 formed on the undoped β-Ga$_2$O$_3$ single crystal film 6 between the source electrode 52 and the drain electrode 53 via a gate insulating film 56, and a source region 54 and a drain region 55 which are formed in the undoped β-Ga$_2$O$_3$ single crystal film 6 respectively under the source electrode 52 and the drain electrode 53.

The structure and the manufacturing method of the high-resistance β-Ga$_2$O$_3$ substrate 2 are the same as the first embodiment.

The gate electrode 51, the source electrode 52, the drain electrode 53, the source region 54, the drain region 55 and the gate insulating film 56 are formed in the same manner as the gate electrode 21, the source electrode 22, the drain electrode 23, the source region 24, the drain region 25 and the gate insulating film 26 in the first embodiment. It should be noted that the source region 54 and the drain region 55 do not need to be provided in the Ga$_2$O$_3$-based MISFET 50.

The undoped β-Ga$_2$O$_3$ single crystal film 6 is a high-resistance β-Ga$_2$O$_3$ single crystal film which does not include a dopant. Although there may be a case where conductivity thereof is low due to crystal defects, etc., electric resistance thereof is sufficiently high and a current never flows from the source electrode 52 to the drain electrode 53 unless voltage is applied to the gate electrode 51. The method of forming the undoped β-Ga$_2$O$_3$ single crystal film 6 is, e.g., based on the method of forming the n-type β-Ga$_2$O$_3$ single crystal film 3 in the first embodiment where the process of implanting the n-type dopant is eliminated.

The Ga$_2$O$_3$-based MISFET 50 functions as a normally-off transistor. When voltage of more than the threshold is applied to the gate electrode 51, a channel is formed in a region of the undoped β-Ga$_2$O$_3$ single crystal film 6 under the gate electrode 51 and a current thus flows from the source electrode 52 to the drain electrode 53.

Fifth Embodiment

Figure 7:
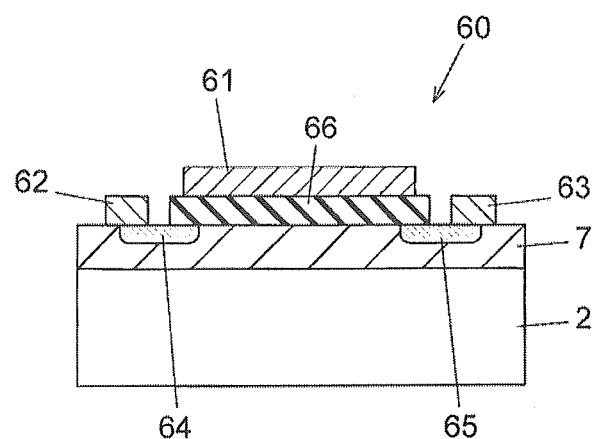
FIG. 7 is a cross sectional view showing a $Ga_2O_3$-based MISFET in a fifth embodiment.

FIG. 7 is a cross sectional view showing a Ga$_2$O$_3$-based MISFET 60 in the fifth embodiment. The Ga$_2$O$_3$-based MISFET 60 includes a p-type β-Ga$_2$O$_3$ single crystal film 7 formed on the high-resistance β-Ga$_2$O$_3$ substrate 2, a source electrode 62 and a drain electrode 63 which are formed on the p-type β-Ga$_2$O$_3$ single crystal film 7, a gate electrode 61 formed on the p-type β-Ga$_2$O$_3$ single crystal film 7 between the source electrode 62 and the drain electrode 63 via a gate insulating film 66, and a source region 64 and a drain region 65 which are formed in the p-type β-Ga$_2$O$_3$ single crystal film 7 respectively under the source electrode 62 and the drain electrode 63.

The structure and the manufacturing method of the high-resistance β-Ga$_2$O$_3$ substrate 2 are the same as the first embodiment.

The gate electrode 61, the source electrode 62, the drain electrode 63, the source region 64, the drain region 65 and the gate insulating film 66 are formed in the same manner as the gate electrode 21, the source electrode 22, the drain electrode 23, the source region 24, the drain region 25 and the gate insulating film 26 in the first embodiment.

The p-type β-Ga$_2$O$_3$ single crystal film 7 is a β-Ga$_2$O$_3$ single crystal film which includes a p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N or P. The method of forming the p-type β-Ga$_2$O$_3$ single crystal film 7 is, e.g., based on the method of forming the n-type β-Ga$_2$O$_3$ single crystal film 3 in the first embodiment where the process of implanting the n-type dopant is replaced with a process of implanting the p-type dopant.

The Ga$_2$O$_3$-based MISFET 60 functions as a normally-off transistor. When voltage of more than the threshold is applied to the gate electrode 61, a channel is formed in a region of the p-type β-Ga$_2$O$_3$ single crystal film 7 under the gate electrode 61 and a current thus flows from the source electrode 62 to the drain electrode 63.

Effects of the Embodiments

According to the present embodiment, it is possible to form high-quality β-Ga$_2$O$_3$ single crystal films by homoepitaxial growth and use of such β-Ga$_2$O$_3$ single crystal films allows high-quality Ga$_2$O$_3$-based MISFETs or Ga$_2$O$_3$-based MESFETs to be formed. In addition, these Ga$_2$O$_3$-based MISFETs and Ga$_2$O$_3$-based MESFETs have excellent performance since a high-quality β-Ga$_2$O$_3$ single crystal film is used as a channel layer.

It should be noted that the invention is not intended to be limited to the above-mentioned embodiments, and the various kinds of modifications can be implemented without departing from the gist of the invention. In addition, constituent elements of the above-mentioned embodiments can be arbitrarily combined without departing from the gist of the invention.

Examples

The Ga$_2$O$_3$-based MESFET 30 in the second embodiment was made and transistor characteristics thereof were evaluated.

(Manufacture of Ga$_2$O$_3$-Based MESFET)

Firstly, 0.25 mol % of MgO was mixed to Ga$_2$O$_3$ powder and a β-Ga$_2$O$_3$-based single crystal was then grown by the FZ method. Next, the high-resistance β-Ga$_2$O$_3$ substrate 2 was cut out of the grown β-Ga$_2$O$_3$-based single crystal so as to have a (010) plane as a main surface and was ground and polished to a thickness of about 350 μm.

Next, the high-resistance β-Ga$_2$O$_3$ substrate 2 was subjected to organic cleaning, acid cleaning and pure water cleaning and was then conveyed to the MBE system. Next, an n-type β-Ga$_2$O$_3$ single crystal was grown on the high-resistance β-Ga$_2$O$_3$ substrate 2 by the MBE to form the n-type β-Ga$_2$O$_3$ single crystal film 3. Here, temperature of the high-resistance β-Ga$_2$O$_3$ substrate 2 was set to 700° C., temperature of the first cell 13$a$ filled with Ga powder to 900° C. and temperature of the second cell 13$b$ filled with SnO$_2$ powder to 770° C. and the n-type β-Ga$_2$O$_3$ single crystal was grown for 30 minutes, thereby forming the n-type β-Ga$_2$O$_3$ single crystal film 3 having a thickness of 0.3 μm. The Sn concentration in the n-type β-Ga$_2$O$_3$ single crystal film 3 was about 8×10$^{17}$/cm$^3$.

After that, the source electrode 32 and the drain electrode 33 each made of Ti and the gate electrode 31 made of Pt were formed on the n-type β-Ga$_2$O$_3$ single crystal film 3. The source region 34 and the drain region 35 were not formed.

(Evaluation of Ga$_2$O$_3$-Based MESFET)

Figure 8:
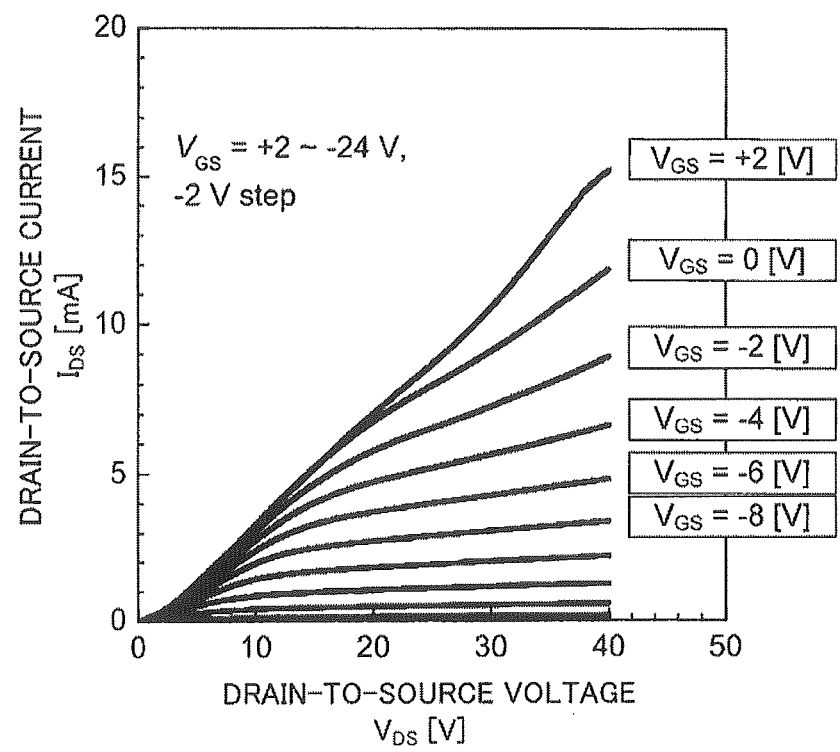
FIG. 8 is a graph showing a relation between drain-to-source voltage and drain-to-source current in Example.

FIG. 8 is a graph showing a relation between drain-to-source voltage and drain-to-source current. In FIG. 8, the horizontal axis indicates voltage V$_{DS}$ between the source electrode 32 and the drain electrode 33 and the vertical axis indicates current I$_{DS}$ between the source electrode 32 and the drain electrode 33. Plural curved lines in the graph respectively shows values measured while changing voltage $V_{GS}$ between the gate electrode 31 and the source electrode 32 from +2V to −24V by −2V.

As shown in FIG. 8, $I_{DS}$ decreases with decreasing $V_{GS}$ and it was conformed that the $Ga_2O_3$-based MESFET 30 operates normally.

Figure 9:
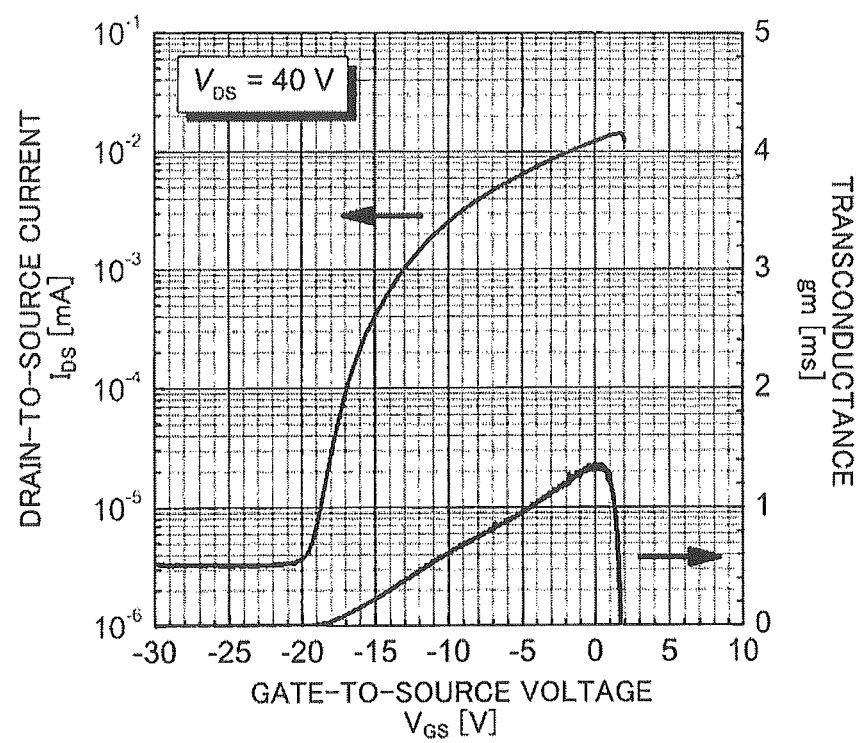
FIG. 9 is a graph showing a relation between gate-to-source voltage and drain-to-source current in Example.

FIG. 9 is a graph showing a relation between gate-to-source voltage and drain-to-source current. In FIG. 9, the horizontal axis indicates voltage $V_{GS}$ between gate electrode 31 and the source electrode 32, the vertical axis on the left side indicates current $I_{DS}$ between the drain electrode 33 and the source electrode 32 and the vertical axis on the right side indicates transconductance gm. A curved line on the left side in the graph shows $I_{DS}$ and that on the right side shows gm Voltage $V_{DS}$ between the source electrode 32 and the drain electrode 33 was fixed to 40V.

As shown in FIG. 9, an on/off ratio (a ratio of ISD when VGS=0V to ISD when VGS=−20V) is as sufficiently large as four digits and it was confirmed that the $Ga_2O_3$-based MESFET 30 has good transistor characteristics.

Figure 10:
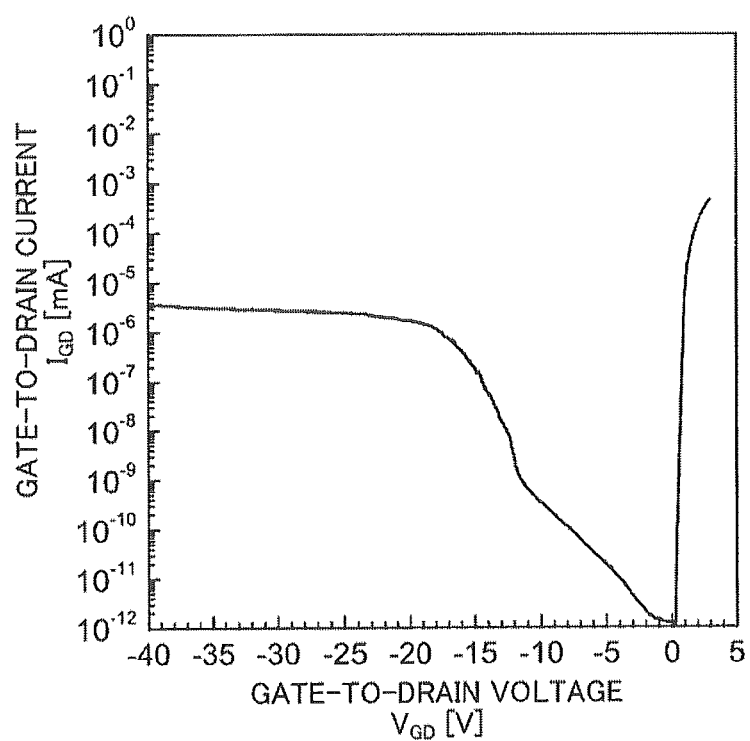
FIG. 10 is a graph showing a relation between gate-to-drain voltage and gate-to-drain current in Example.

FIG. 10 is a graph showing a relation between gate-to-drain voltage and gate-to-drain current. In FIG. 10, the horizontal axis indicates voltage $V_{GD}$ between the gate electrode 31 and the drain electrode 33 and the vertical axis indicates gate leakage current $I_{GD}$ between the gate electrode 31 and the drain electrode 33.

As shown in FIG. 10, gate leakage current IGD is in the order of μA in the region of VGD=not more than −20V and it was confirmed that the $Ga_2O_3$-based MESFET 30 has good transistor characteristics.

Although the embodiments and example of the invention have been described above, the invention according to claims is not to be limited to the above-mentioned embodiments and example. Further, it should be noted that all combinations of the features described in the embodiments and example are not necessary to solve the problem of the invention.

INDUSTRIAL APPLICABILITY

A high-quality $Ga_2O_3$-based semiconductor element is provided.

REFERENCE SIGNS LIST

1: MBE system
2: high-resistance β-$Ga_2O_3$ substrate
3: n-type β-$Ga_2O_3$ single crystal film
6: undoped β-$Ga_2O_3$ single crystal film
7: p-type β-$Ga_2O_3$ single crystal film
20, 40, 50, 60: $Ga_2O_3$-based MISFET
21, 31, 41, 51, 61: gate electrode
22, 32, 42, 52, 62: source electrode
23, 33, 43, 53, 63: drain electrode
24, 34, 44, 54, 64: source region
25, 35, 45, 55, 65: drain region
26, 46, 56, 66: gate insulating film
30: $Ga_2O_3$-based MESFET

The invention claimed is:
1. A $Ga_2O_3$-based semiconductor element, comprising:
a β-$Ga_2O_3$ single crystal film that is formed on a main surface of a β-$Ga_2O_3$ substrate, the main surface being rotated from 50° to 90° with respect to a (100) plane;
a source electrode and a drain electrode that are formed on a same side of the β-$Ga_2O_3$ single crystal film;
a gate electrode that is formed on the β-$Ga_2O_3$ single crystal film between the source electrode and the drain electrode;
a first region formed in the β-$Ga_2O_3$ single crystal film under the source electrode and the drain electrode and including a controlled first dopant concentration; and
a second region formed to surround the first region and including a controlled second dopant concentration lower than the controlled first dopant concentration,
wherein the β-$Ga_2O_3$ substrate includes a p-type dopant to be a high electrical resistance.

2. The $Ga_2O_3$-based semiconductor element according to claim 1, wherein the semiconductor element further comprises a $Ga_2O_3$-based MISFET, and
wherein the gate electrode is formed on the β-$Ga_2O_3$ single crystal film via a gate insulating film.

3. The $Ga_2O_3$-based semiconductor element according to claim 1, wherein the first region comprises a source region and a drain region formed in the β-$Ga_2O_3$ single crystal film under the source electrode and the drain electrode, respectively.

4. The $Ga_2O_3$-based semiconductor element according to claim 3, wherein the β-$Ga_2O_3$ single crystal film, the source region and the drain region are n-type, and
wherein the second region comprises a p-type or high-resistance body region formed in the β-$Ga_2O_3$ single crystal film so as to surround the source region.

5. The $Ga_2O_3$-based semiconductor element according to claim 1, wherein the semiconductor element further comprises a $Ga_2O_3$-based MESFET, and
wherein the gate electrode is formed directly on the β-$Ga_2O_3$ single crystal film.

6. The $Ga_2O_3$-based semiconductor element according to claim 5, wherein the β-$Ga_2O_3$ single crystal film is n-type, and
wherein the semiconductor element further comprises an n-type source region and an n-type drain region formed in the β-$Ga_2O_3$ single crystal film under the source electrode and the drain electrode, respectively.

7. The $Ga_2O_3$-based semiconductor element according to claim 2, wherein the first region comprises a source region and a drain region formed in the β-$Ga_2O_3$ single crystal film under the source electrode and the drain electrode, respectively.

8. The $Ga_2O_3$-based semiconductor element according to claim 1, wherein an upper surface of the first region is flush with an upper surface of the β-$Ga_2O_3$ single crystal film.

9. The $Ga_2O_3$-based semiconductor element according to claim 8, wherein an upper surface of the second region is flush with an upper surface of the β-$Ga_2O_3$ single crystal film.

10. The $Ga_2O_3$-based semiconductor element according to claim 9, wherein the source electrode is disposed on the upper surface of the first region.

11. The $Ga_2O_3$-based semiconductor element according to claim 9, wherein the source electrode abuts the upper surface of the first region.

12. The $Ga_2O_3$-based semiconductor element according to claim 11, wherein the gate electrode is formed on the β-$Ga_2O_3$ single crystal film via a gate insulating film disposed on a bottom surface of the gate electrode.

13. The $Ga_2O_3$-based semiconductor element according to claim 12, wherein a bottom surface of the gate insulating film is disposed on the upper surface of the first region.

14. The $Ga_2O_3$-based semiconductor element according to claim 12, wherein a bottom surface of the gate insulating film abuts the upper surface of the first region.

15. The $Ga_2O_3$-based semiconductor element according to claim 14, wherein the bottom surface of the gate insulating film is further disposed on the upper surface of the second region.

16. The $Ga_2O_3$-based semiconductor element according to claim 15, wherein the bottom surface of the gate insulating film further abuts the upper surface of the second region.

17. The $Ga_2O_3$-based semiconductor element according to claim 16, wherein the bottom surface of the gate insulating film further abuts an upper surface of the $\beta$-$Ga_2O_3$ single crystal film.

* * * * *